United States Patent
Kim et al.

(10) Patent No.: US 7,879,735 B2
(45) Date of Patent: Feb. 1, 2011

(54) CLEANING SOLUTION FOR SILICON SURFACE AND METHODS OF FABRICATING SEMICONDUCTOR DEVICE USING THE SAME

(75) Inventors: Sang-Yong Kim, Yongin-si (KR); Chang-Ki Hong, Seongnam-si (KR); Woo-Gwan Shim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 918 days.

(21) Appl. No.: 11/656,470

(22) Filed: Jan. 23, 2007

(65) Prior Publication Data

US 2007/0178706 A1 Aug. 2, 2007

(30) Foreign Application Priority Data

Jan. 27, 2006 (KR) .................... 10-2006-0009117

(51) Int. Cl.
*H01L 21/302* (2006.01)
(52) U.S. Cl. .................. 438/749; 438/704; 438/719; 438/745; 438/753; 257/E21.309; 134/1.2; 134/1.3; 510/175
(58) Field of Classification Search ............. 438/704, 438/719, 745, 749, 753; 257/E21.309; 134/1.2, 134/1.3; 510/175
See application file for complete search history.

(56) References Cited

U.S. PATENT DOCUMENTS

| 5,603,235 | A | * | 2/1997 | Um | 72/46 |
| 6,727,187 | B2 | * | 4/2004 | Takeshima et al. | 438/745 |
| 7,216,653 | B2 | * | 5/2007 | Kim et al. | 134/1.2 |
| 7,435,301 | B2 | * | 10/2008 | Mun et al. | 134/2 |
| 7,449,417 | B2 | * | 11/2008 | Kim et al. | 438/753 |
| 7,507,670 | B2 | * | 3/2009 | Shih et al. | 438/704 |
| 7,562,662 | B2 | * | 7/2009 | Kim et al. | 134/1.2 |
| 2003/0148627 | A1 | * | 8/2003 | Aoki et al. | 438/749 |
| 2004/0115952 | A1 | * | 6/2004 | Kim et al. | 438/754 |
| 2004/0242015 | A1 | * | 12/2004 | Kim et al. | 438/753 |
| 2004/0244823 | A1 | * | 12/2004 | Kim et al. | 134/28 |

FOREIGN PATENT DOCUMENTS

| JP | 05-021595 | 1/1993 |
| JP | 05-144798 | 6/1993 |
| JP | 2004-134600 | 4/2004 |
| KR | 102004010483 A | 12/2004 |

OTHER PUBLICATIONS

Korean Office Action dated Nov. 15, 2006.

* cited by examiner

*Primary Examiner*—Andy Huynh
(74) *Attorney, Agent, or Firm*—Harness, Dickey & Pierce, P.L.C.

(57) ABSTRACT

A cleaning solution and methods of fabricating semiconductor devices using the same are provided. A cleaning solution used for cleaning a silicon surface and methods of fabricating a semiconductor device using the same are also provided. The cleaning solution may include 0.01 to 1 wt % of fluoric acid, 20 to 50 wt % of oxidizer and 50 to 80 wt % of water. The cleaning solution may further include 1 to 20 wt % of acetic acid. The cleaning solution may be used to clean a silicon surface exposed during fabrication processes of a semiconductor device. The cleaning solution may reduce damage of other material layers (e.g., a tungsten layer or a silicon oxide layer) and enable the silicon surface to be selectively etched.

17 Claims, 6 Drawing Sheets

CLEANING SOLUTION FOR SILICON SURFACE AND METHODS OF FABRICATING SEMICONDUCTOR DEVICE USING THE SAME

PRIORITY STATEMENT

This application claims the benefit of priority under 35 U.S.C. §119 from Korean Patent Application No. 10-2006-0009117, filed Jan. 27, 2006, the disclosure of which is hereby incorporated herein by reference in its entirety.

BACKGROUND OF INVENTION

1. Field of the Invention

Example embodiments of the present invention relate to a cleaning solution and methods of fabricating semiconductor devices using the same. Other example embodiments of the present invention relate to a cleaning solution used for cleaning a silicon surface and methods of fabricating a semiconductor device using the same.

2. Description of the Related Art

The fabrication of a semiconductor device may include an ion implantation process to form an impurity diffusion layer (e.g., a well and source/drain regions) in a silicon substrate; a deposition or growth process to form conductive, or insulating, thin films on the silicon substrate and patterning the thin films to form various shaped-structures; a contact formation process to electrically connect stacked conductive structures such that circuits are formed; and other similar processes. The state of an exposed silicon surface in each of the processes may have an influence on the film quality of thin films formed during subsequent processes. The exposed silicon surface may deteriorate due to contamination from materials. The exposed silicon surface may be damaged during the fabrication processes. For example, the exposed silicon surface may be contaminated by various contaminated materials (e.g., a natural oxide layer, organic materials, metal impurities and/or particles) during fabrication processes or from handling the silicon substrate between the processes. The exposed silicon surface may be damaged during a dry etch process for patterning the thin films. The exposed silicon surface may be damaged during an ion implantation process for forming a well or source/drain regions.

A cleaning process for removing contaminates from the exposed silicon surface before an each process, or removing the damaged portion of the silicon surface, is generally performed. It may be necessary to perform the cleaning process before performing a process that is sensitive or may be influenced by the state of the silicon surface (e.g., an epitaxial process, a salicide process or a self-aligned contact (SAC) process). It may be necessary to remove the damaged portion of the exposed silicon surface before each process because the exposed silicon surface may function as a source of leakage during contact, or an increase in contact resistance with other layers and/or devices. The exposed silicon surface may also cause crystal defects in an epitaxial layer or a metal silicide layer contacting the exposed silicon surface. The defects may increase surface roughness of the crystal.

Generally, a standard cleaning method (e.g., standard clean 1 (SC1) which is a mixture solution including hydrogen peroxide ($H_2O_2$), ammonium hydroxide ($NH_4OH$) and deionized water (DI water) or a diluted fluoric acid aqueous solution) may be used in the cleaning process of the silicon surface. The solution may be selected based upon the manner in which the silicon surface is used. Due to a lower etch selectivity for silicon with respect to a silicon oxide layer, it may be undesirable to use the SC1 or the diluted fluoric acid aqueous solution for an extended period of time. As such, the silicon surface may not be sufficiently cleaned. As semiconductor devices become more integrated and metals (e.g., tungsten) are used for gate electrodes, the gate electrodes may corrode during the cleaning process. Corrosion may deteriorate electrical characteristics the semiconductor devices.

SUMMARY OF THE INVENTION

Example embodiments of the present invention are directed to a cleaning solution and methods of fabricating semiconductor devices using the same. Other example embodiments of the present invention are directed to a cleaning solution used for cleaning a silicon surface and methods of fabricating a semiconductor device using the same.

Example embodiments of the present invention are directed to a cleaning solution used to more selectively remove a damaged portion of an exposed silicon surface before performing subsequent fabrication processes on a semiconductor device.

Other example embodiments of the present invention are directed to a cleaning solution for a silicon surface capable of decreasing damage due to etching and/or corrosion of a metal gate electrode (e.g., tungsten).

In accordance with example embodiments of the present invention, a cleaning solution having an optimized or improved composition used to clean an exposed silicon surface is provided. The cleaning solution may include 0.01 to 1 wt % of fluoric acid (HF), 20 to 50 wt % of an oxidizer and 50 to 80 wt % of water ($H_2O$). The cleaning solution may include 1 to 20 wt % of acetic acid ($CH_3COOH$). The oxidizer may be nitric acid ($HNO_3$) or phosphoric acid ($H_3PO_4$).

In other example embodiments of the present invention, methods of fabricating a semiconductor device are provided. According to example embodiments of the present invention, a method may include preparing a substrate having an exposed silicon surface. The exposed silicon surface may be cleaned using a cleaning solution including 0.01 to 1 wt % of fluoric acid, 20 to 50 wt % of an oxidizer and 50 to 80 wt % of water.

In other example embodiments of the present invention, the cleaning solution may also include 1 to 20 wt % of acetic acid. In example embodiments of the present invention, cleaning the exposed silicon surface may be performed at a temperature of 20° C. to 50° C.

In other example embodiments of the present invention, the oxidizer may be nitric acid or phosphoric acid.

In example embodiments of the present invention, the exposed silicon surface may be a single crystal silicon surface or a polysilicon surface.

In example embodiments of the present invention, a metal silicide layer or an epitaxial layer may be formed on the exposed silicon surface after cleaning the exposed silicon surface.

In example embodiments of the present invention, preparing the substrate may include forming a gate pattern selectively exposing the silicon surface on the substrate.

According to example embodiments of the present invention, the gate pattern may be formed from a polysilicon layer pattern. The gate pattern may be formed from a plurality of layers including a polysilicon layer pattern and a tungsten layer pattern, which may be sequentially stacked. The gate pattern may be formed from a plurality of layers including a polysilicon layer pattern, a tungsten nitride layer pattern, a tungsten layer pattern and a capping layer pattern, which may be sequentially stacked.

In accordance with other example embodiments of the present invention, a method of fabricating a semiconductor device may include forming an insulating layer on a substrate having a silicon surface. An opening may be formed in, or penetrating, the insulating layer. The silicon surface exposed by the opening may be cleaned using a cleaning solution including 0.01% to 1 wt % of fluoric acid, 20% to 50 wt % of an oxidizer and 50% to 80 wt % of water.

In example embodiments of the present invention, a gate pattern may be formed on the substrate prior to forming the insulating layer. The silicon surface exposed by the opening may be a portion of the substrate adjacent to the gate pattern.

BRIEF DESCRIPTION OF THE DRAWINGS

Example embodiments of the present invention will be more clearly understood from the following detailed description taken in conjunction with the accompanying drawings.

FIGS. 1 through 3 are diagrams illustrating cross-sectional views of a method of fabricating a semiconductor device according to example embodiments of the present invention;

FIGS. 4 and 5 are diagrams illustrating cross-sectional views of a method of fabricating a semiconductor device according to example embodiments of the present invention;

FIGS. 6 through 8 are diagrams illustrating cross-sectional views of a method of fabricating a semiconductor device according to example embodiments of the present invention;

FIG. 9 is a graph illustrating the relationship between etch characteristics of a polysilicon layer and a thermal oxide layer in relation to a water content of a cleaning solution according to example embodiments of the present invention;

FIG. 10 is a graph illustrating the relationship between etch characteristics of a polysilicon layer and a thermal oxide layer in relation to a fluoric acid content of a cleaning solution according to example embodiments of the present invention; and FIG. 11 is a graph illustrating the relationship between etch characteristics of a polysilicon layer and a thermal oxide layer in relation to an acetic acid content of a cleaning solution according to example embodiment of the present invention.

DETAILED DESCRIPTION OF EXAMPLE EMBODIMENTS

Figure 1:
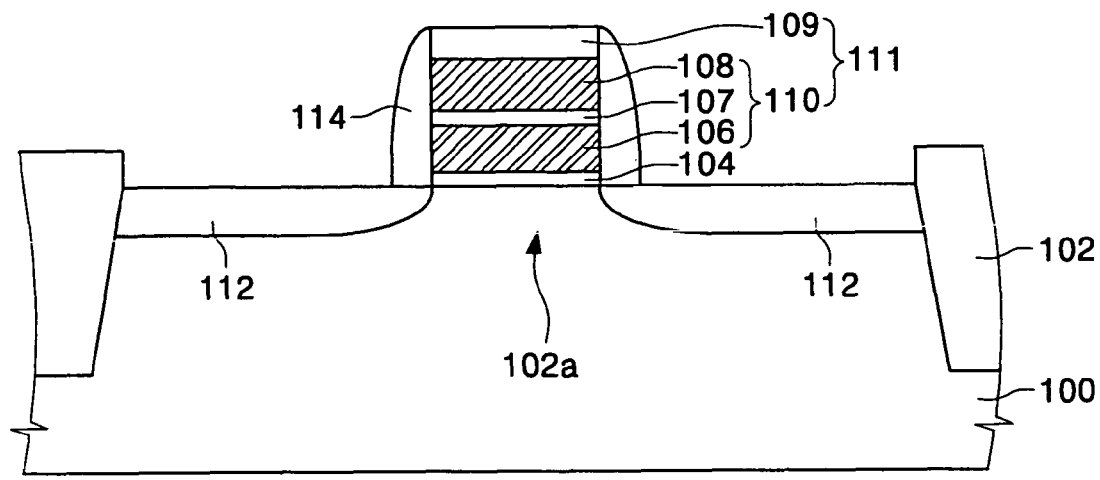
FIGS. 1-11 represent non-limiting, example embodiments of the present invention as described herein.

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments of the present invention.

Spatially relative terms, such as "beneath", "below", "lower", "above", "upper" and the like, may be used herein for ease of description to describe one element or a feature's relationship to another element or feature as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Also, the use of the words "compound," "compounds," or "compound(s)," refer to either a single compound or to a plurality of compounds. These words are used to denote one or more compounds but may also just indicate a single compound.

Example embodiments of the present invention are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments of the invention should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope of the present invention.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments of the present invention belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments of the present invention, various aspects of the present invention will be described in detail with reference to the attached drawings. However, the present invention is not limited to the example embodiments described.

Example embodiment of the present invention relate to a cleaning solution and methods of fabricating semiconductor devices using the same. Other example embodiments of the present invention relate to a cleaning solution used for cleaning a silicon surface and methods of fabricating a semiconductor device using the same.

Figure 2:
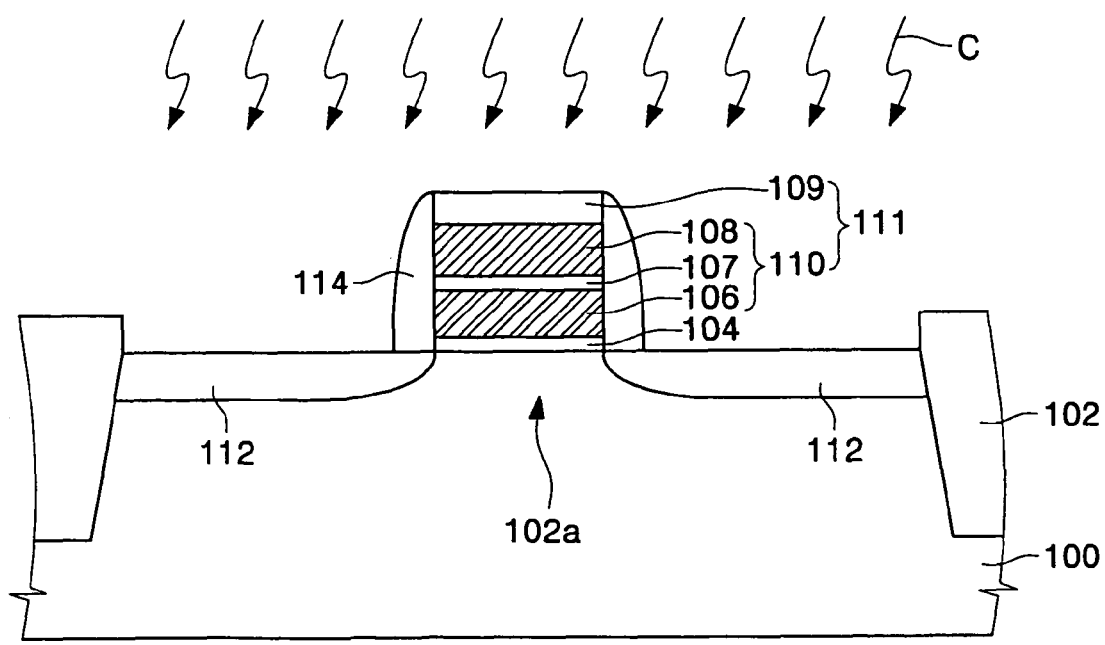
Figure 3:
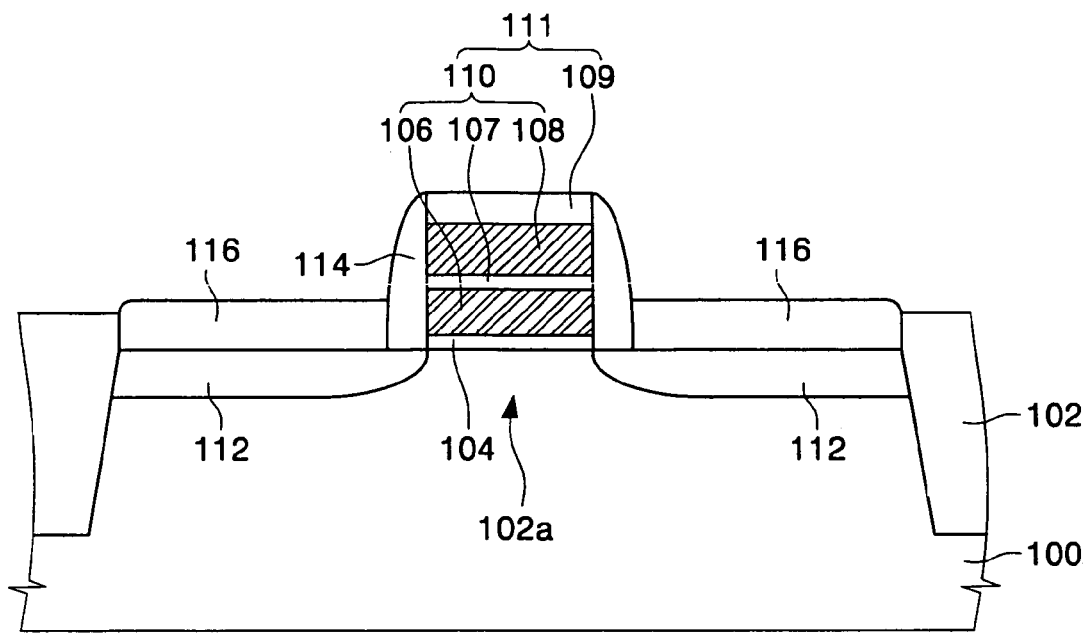

FIGS. 1 through 3 are diagrams illustrating cross-sectional views of a method of fabricating a semiconductor device according to example embodiments of the present invention.

Referring to FIG. 1, a substrate 100 is prepared. The substrate 100 may be a single crystal silicon substrate, a polysilicon substrate or a silicon-on-insulator (SOI) substrate. An isolation layer 102 defining an active region 102a may be formed in the substrate 100. The isolation layer 102 may be formed from a silicon oxide layer (e.g., a high density plasma (HDP) oxide layer) using a shallow trench isolation (STI) process. A gate insulating layer may be formed on the active region 102a. The gate insulating layer may be formed from a thermal oxide layer. A gate conductive layer and a capping layer may be sequentially formed on the substrate 100 having the gate insulating layer. The gate conductive layer may be formed by depositing a polysilicon layer, a tungsten nitride layer and a tungsten layer sequentially. The capping layer may be formed from a silicon nitride layer or a silicon oxynitride layer. The gate conductive layer and the capping layer may be sequentially patterned, forming a gate pattern 111 on the active region 102a. The gate pattern 111 may include a gate electrode 110 and a capping layer pattern 109, which are sequentially stacked. The gate electrode 110 may include a polysilicon layer pattern 106, a tungsten nitride layer pattern 107 and a tungsten layer pattern 108, which are sequentially stacked.

The gate conductive layer may be formed from a polysilicon layer, omitting the tungsten nitride layer pattern 107 and the tungsten layer pattern 108. If the gate conductive layer is formed the polysilicon layer (omitting the tungsten nitride layer pattern 107 and the tungsten layer pattern 108), then the gate electrode 110 may be formed of the polysilicon layer pattern 106 (omitting the tungsten nitride layer pattern 107 and the tungsten layer pattern 108). When the gate electrode 110 is formed of the polysilicon layer pattern 106, the capping layer pattern 109 may be omitted. The gate pattern 111 may be formed of the polysilicon layer pattern 106 (omitting the tungsten nitride layer pattern 107 and the tungsten layer pattern 108).

The gate insulating layer may be patterned during the formation of the gate pattern 111. As a result, a gate insulating layer pattern 104 may be formed between the gate pattern 111 and the active region 102a, as shown in FIG. 1.

Impurity ions may be implanted into the active region 102a using the gate pattern 111 and the isolation layer 102 as ion implantation masks, forming source/drain regions 112. The impurity ions may be n-type or p-type impurity ions. After the source/drain regions 112 are formed, a gate spacer 114 may be formed on, or covering, the sidewall of the gate pattern 111. The gate spacer 114 may be formed by forming a spacer layer (e.g., a silicon nitride layer) on the substrate 100 having the source/drain regions 112 and anisotropically etching the spacer layer.

Referring to FIG. 2, an exposed silicon surface on the substrate 100 (in other words, a surface of the active region 102a exposed by the gate pattern 111) may be damaged during the anisotropic etch process for patterning the gate pattern 111 and/or the ion implantation process for forming the source/drain region 112. Because the damaged portion of the exposed silicon surface may have an undesirable influence on a physical property of a thin film formed during subsequent processes, it may be necessary to remove the damaged portion of the exposed silicon surface by performing a cleaning process C using an appropriate cleaning solution. The cleaning process C may be performed by selectively etching and removing the exposed silicon surface of the substrate 100 (in other words, the surface exposed by the gate pattern 111), while reducing damage of other material layers formed on the substrate 100. The exposed silicon substrate may be etched or removed to a desired thickness. Etching of the silicon oxide layer used to form the isolation layer 102 and the tungsten layer pattern 108 used to form the gate electrode 110 may be suppressed, or retarded. A cleaning solution used in the cleaning process C may increase an etch selectivity of silicon with respect to a silicon oxide layer and/or a tungsten layer.

In example embodiments of the present invention, the cleaning solution used in the cleaning process C may include 0.01 to 1 weight percent (wt %) of fluoric acid, 20 to 50 wt % of an oxidizer and 50 to 80 wt % of water. By using a cleaning solution having an optimized or improved composition as described above, a desired or higher etch selectivity of silicon with respect to a silicon oxide layer may be maintained or achieved. Damage due to etching and/or corrosion of the tungsten layer pattern 108 during the cleaning process C may decrease. The oxidizer may oxidize the silicon surface to form a chemical oxide. The oxidizer may be nitric acid or phosphoric acid. The fluoric acid functions as an etchant to etch and remove the chemical oxide formed by the oxidizer. The water may be deionized water. The cleaning solution may include 1% to 20 wt % of acetic acid. When acetic acid is used as a diluent with water, generation of finer defects on the silicon surface during the cleaning process may be reduced or prevented. Uniformity of the cleaning may also increase. The cleaning process may be performed at a temperature of about 20° C. to 50° C.

When the gate electrode 110 is formed of the polysilicon layer pattern 106 (omitting the tungsten nitride layer pattern 107 and the tungsten layer pattern 108) and the capping layer pattern 109 is omitted as described above, the damaged surface portion of the polysilicon layer pattern 106 may be also removed during the cleaning process C.

Referring to FIG. 3, a first epitaxial layer or a plurality of epitaxial layers 116 (hereinafter the 'epitaxial layers 116') may be deposited or grown on the source/drain regions 112 after the cleaning process C is performed. The epitaxial layers 116 may be formed using a selective epitaxial growth process. When the gate electrode 110 is formed of the polysilicon layer pattern 106 (omitting the tungsten nitride layer pattern 107 and the tungsten layer pattern 108) and the capping layer pattern 109 is omitted as described above, a second epitaxial layer or a plurality of epitaxial layers (hereinafter the 'second epitaxial layers') (not shown) may be formed on the polysilicon layer pattern 106. The second epitaxial layers may have a different crystal structure from the epitaxial layers 116. While the epitaxial layers 116 may have the same single crystal structure as that of the silicon substrate 100, the second epitaxial layer formed on the polysilicon layer pattern 106 may have a polycrystal structure. The epitaxial layers 116 may be formed on the source/drain regions 112 or on the source/drain region 112 and the gate electrode 110 after the cleaning process C is performed. As such, surface roughness or inner defects due to the the exposed silicon surface of the substrate 100 may be reduced.

Figure 4:
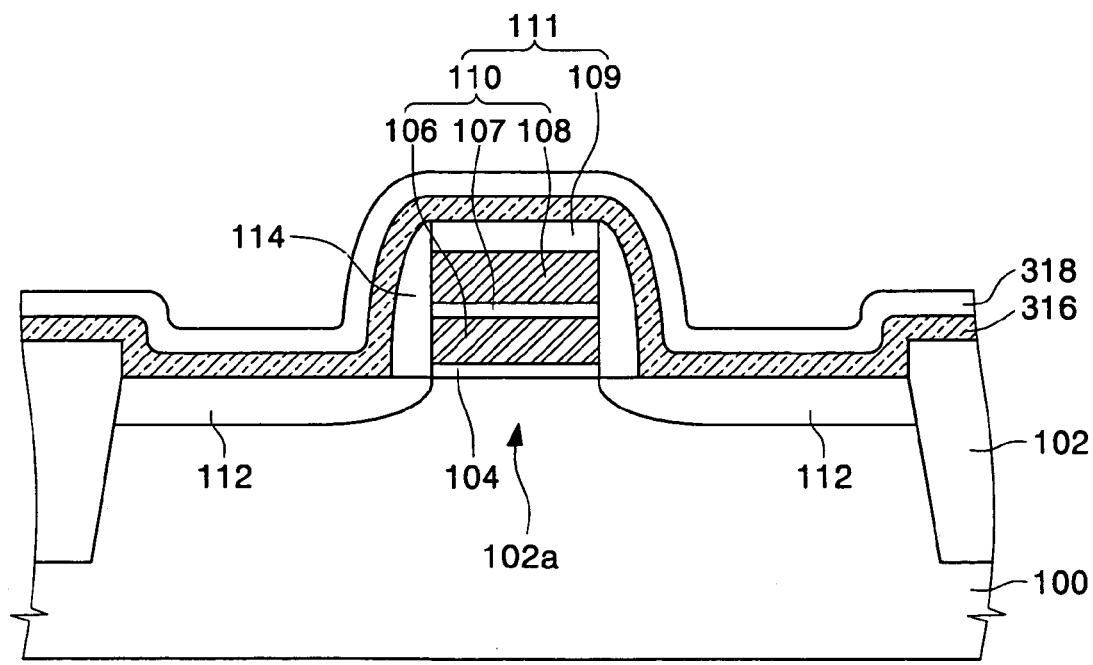
Figure 5:
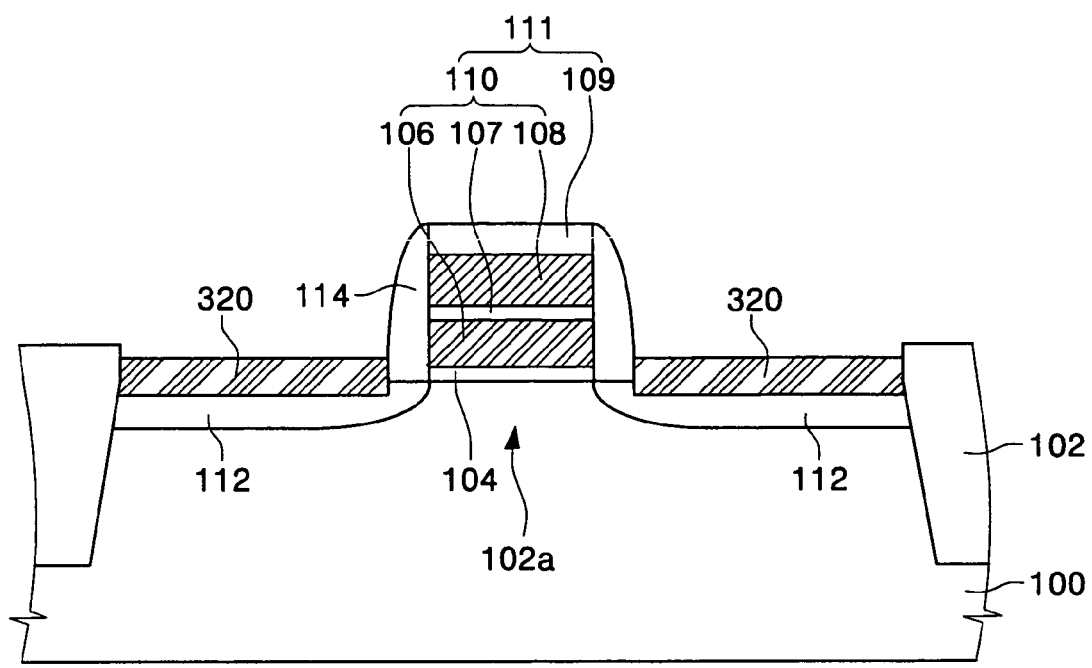

FIGS. 4 and 5 are diagrams illustrating cross-sectional views of a method of fabricating a semiconductor device according to example embodiments of the present invention.

Referring to FIGS. 1, 2 and 4, as described above with reference to FIGS. 1 and 2, a cleaning process C may be performed on the exposed silicon surface of the substrate 100 (in other words, the surface portion of the active region 102a exposed by the gate pattern 111) using the cleaning solution as described above after the gate pattern 111 and the source/drain regions 112 are formed on the substrate 100. After the cleaning process C is performed to remove the damaged portion of the exposed silicon surface, a metal layer 316 and a silicide capping layer 318 may be sequentially formed on the substrate 100. The metal layer 316 may be formed from a nickel layer, a cobalt layer, a titanium layer or the like. The silicide capping layer 318 may be formed from a titanium nitride layer.

Referring to FIG. 5, a silicide thermal treatment may be performed on the substrate 100 having the metal layer 316 and the silicide capping layer 318, forming metal silicide layers 320 on the source/drain regions 112. The metal silicide layers 320 may be nickel silicide layers, cobalt silicide layers or titanium silicide layers depending on the metal layer 316. The silicide capping layer 318 and any non-reacted portion of the metal layer 316 may be removed. When the gate electrode 110 is formed from the polysilicon layer pattern 106 (omitting the tungsten nitride layer pattern 107 and the tungsten layer pattern 108) and the capping layer pattern 109 is omitted as described above, a metal silicide layer may also be formed on the gate electrode 106.

The metal silicide layers 320 may be formed on the source/drain regions 112 or on the source/drain regions 112 and the gate electrode 106 after the cleaning process C is performed. Surface roughness or inner defects due to the condition of the exposed silicon surface of the substrate 100 may decrease.

Figure 6:
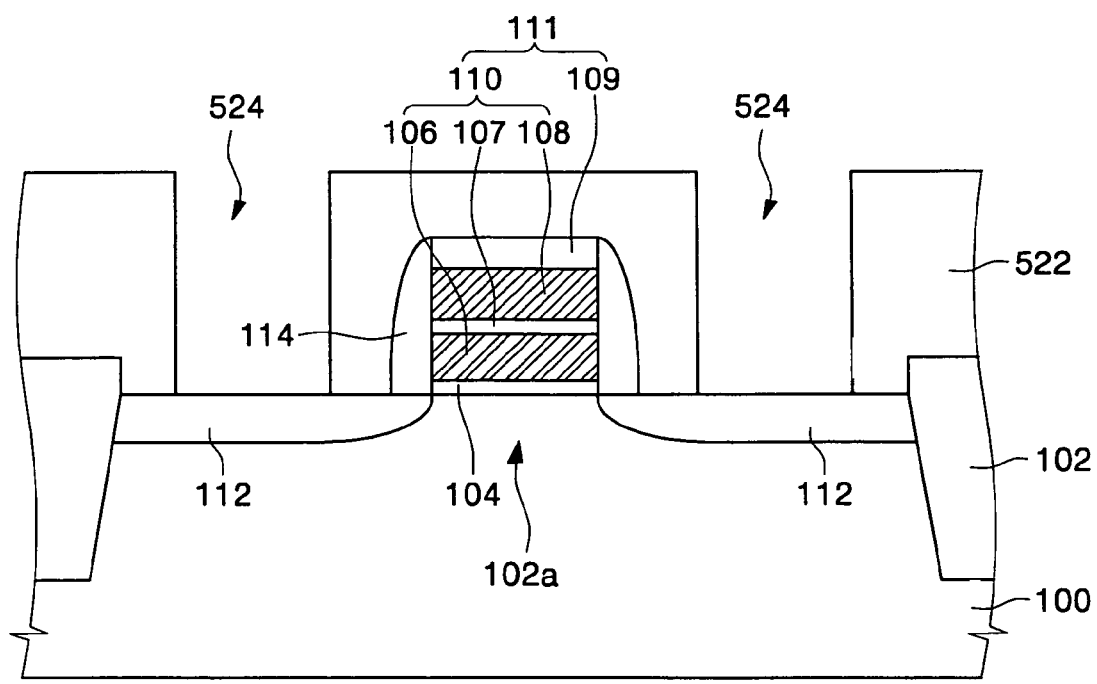
Figure 7:
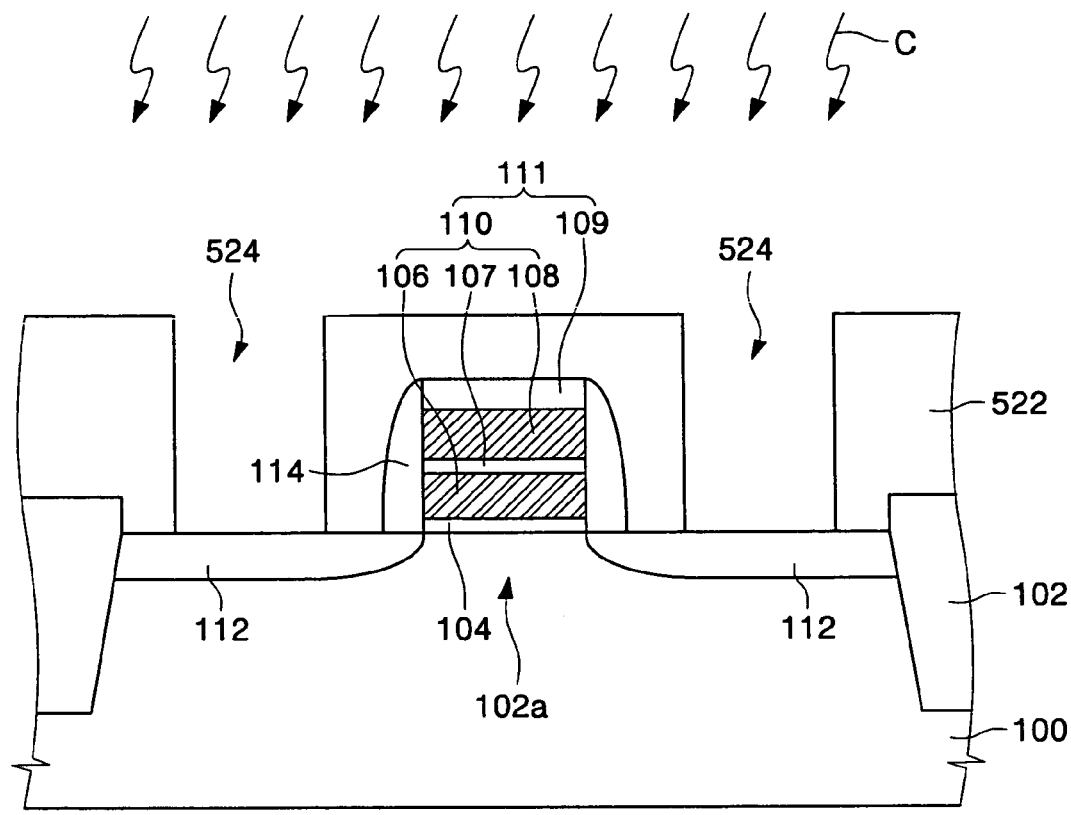
Figure 8:
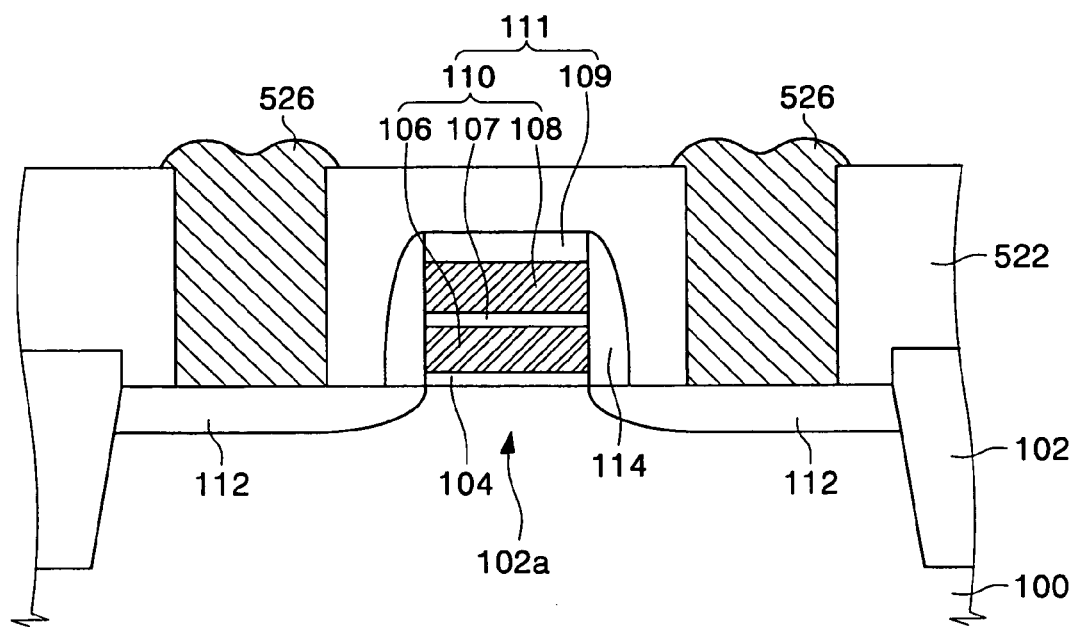

FIGS. 6 through 8 are diagrams illustrating cross-sectional views of a method of fabricating a semiconductor device according to example embodiments of the present invention.

Referring to FIGS. 1 and 6, a gate pattern 111 and source/drain regions 112 may be formed on the substrate 100 as described in FIG. 1. An insulating layer 522 may be formed on the silicon substrate 100 having the gate pattern 111. The insulating layer 522 may be, for example, formed from a borophosphosilicate glass (BPSG) layer. The insulating layer 522 may be patterned, forming openings 524 exposing the surface portion of the substrate 100 adjacent to the gate pattern 111 (in other words, the surface of the source/drain regions 112).

Referring to FIG. 7, the surface of the silicon substrate 100 exposed by the openings 524 may be damaged during an anisotropic etch process for patterning the insulating layer 522. A cleaning process C using the cleaning solution as described above in FIG. 2 may be performed to remove the damaged surface portion of the substrate 100 exposed by the openings 524. By performing the cleaning process C using the cleaning solution as described above, loss or incidental removal of the isolation layer 102 and the tungsten layer pattern 108 may decrease. The damaged surface portion of the substrate 100 exposed by the openings 524 may be selectively removed.

Referring to FIG. 8, after the cleaning process C is performed, a conductive layer may be formed on the surface of the silicon substrate 100 having the openings 524 and the conductive layer may be patterned, forming contact plugs 526 filling the openings 524.

Although not shown in the drawing, the openings 524 may be formed to expose the polysilicon surface on the substrate 100. For example, when the gate electrode 110 is formed of the polysilicon layer pattern 106, the openings 524 may expose the upper surface of the gate electrode 110.

COMPARATIVE EXAMPLE

Tungsten etch rates of a cleaning solution according to example embodiments of the present invention and a conventional cleaning solution are shown in Table 1 (below). The results shown in Table 1 were obtained by sequentially forming a silicon oxide layer having a thickness of about 1000 Å and a tungsten layer having a thickness of about 500 Å on each silicon substrate. For each sample, the tungsten layer was etched using of the respective cleaning solution having the compositions listed in Table 1 for 10 minutes.

TABLE 1

| | COMPOSITION | | | |
| --- | --- | --- | --- | --- |
| | Fluoric Acid (wt %) | Nitric Acid (wt %) | Deionized Water (wt %) | ETCH RATE OF TUNGSTEN (Å/min) |
| Solution 1 | 0.043 | 33 | 66.957 | 0 |
| Solution 2 | 0.43 | 33 | 66.57 | <10 |
| Comparative Solution | 0.043 | 17 | 82.957 | >100 |

When the deionized water content exceeds 80 wt % or is about 83 wt %, the tungsten etch rate may increase to 100 Å/min. When the deionized water content is about 67 wt %, a tungsten etch rate may decrease to 10 Å/min or less. The results show that the deionized water content in the cleaning solution formed of fluoric acid, nitric acid and deionized water may influence the etch rate of tungsten. In order to reduce or prevent damage due to etching and/or corrosion of tungsten used as the gate electrode during the cleaning process, the water content in the cleaning solution formed of fluoric acid, nitric acid and deionized water may be 80 wt % or less. When the water content in the cleaning solution is smaller, it may be difficult to control the cleaning process because silicon may be more excessively etched. As such, the water content in the cleaning solution formed of fluoric acid, nitric acid and water may vary in a range of 50 to 80 wt %.

When the deionized water content is less than 80 wt %, of the fluoric acid content may not influence an etch rate of tungsten to the extent desired. In other words, when the deionized water content is about 67 wt %, the etch rate of tungsten may be lower (e.g., less than 10 Å/min) although the fluoric acid content may increase from 0.043 wt % to 0.43 wt % (e.g., by a factor of ten). It is acknowledged that the etch rate of tungsten may be reduced by adjusting and/or maintaining the water content to less than 80 wt %. The etch rate of silicon may be controlled by adjusting the fluoric acid content.

Figure 9:
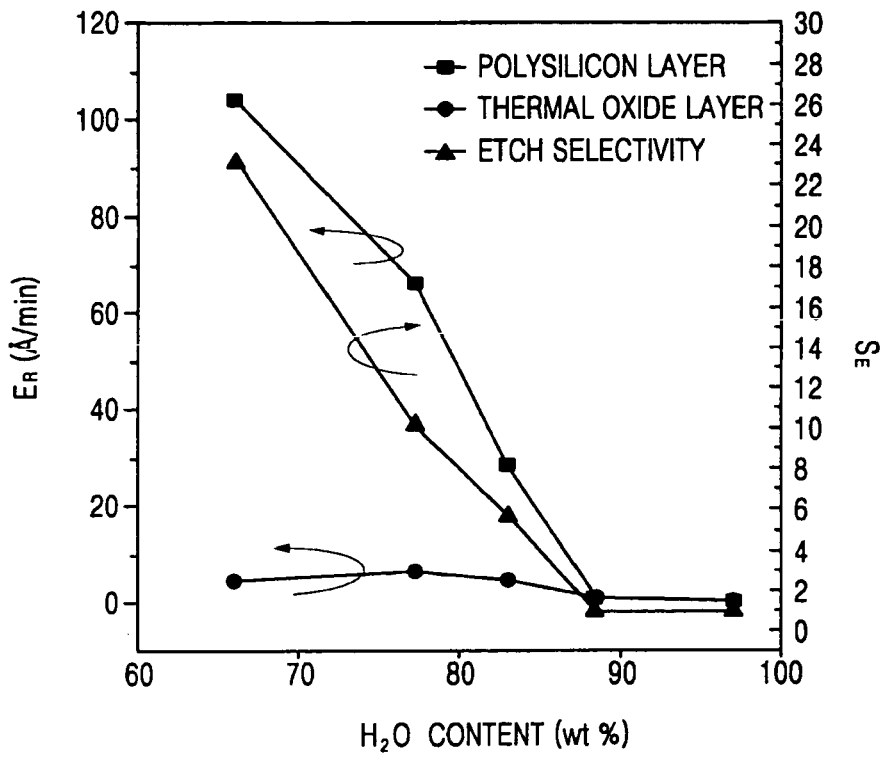

FIG. 9 is a graph illustrating the relationship between etch characteristics of a polysilicon layer and a thermal oxide layer in relation to a water content of a cleaning solution according to example embodiments of the present invention. The cleaning solution is formed of fluoric acid, nitric acid and water.

The results of FIG. 9 were obtained by forming a polysilicon layer and a thermal oxide layer on a silicon substrate. The polysilicon layer and the thermal oxide layer were etched at a room temperature while increasing the water content of a cleaning solution formed of fluoric acid, nitric acid and water. The cleaning solution was prepared by mixing 0.043 wt % of fluoric acid, 33 wt % of nitric acid and 66.957 wt % of deionized water. In FIG. 9, data indicated by a symbol '-■-' represents an etch rate ($E_R$) of the polysilicon layer and data indicated by a symbol '-●-' represents an etch rate ($E_R$) of the thermal oxide layer. Data indicated by a symbol '-▲-' represents an etch selectivity ($S_E$) of the polysilicon layer with respect to the thermal oxide layer.

Referring to FIG. 9, as the deionized water content increases, the etch rate of the thermal oxide layer remains fairly constant. The etch rate of the polysilicon layer decreases. As a result, an etch selectivity of the polysilicon layer with respect to the thermal oxide layer decreases from about 23 to less than 10 as the deionized water content increases to more than 80 wt %. When the deionized water content of the cleaning solution is 80 wt % or less, the etch selectivity of the polysilicon layer with respect to the thermal oxide layer is greater than 10. The results of Table 1 and FIG. 9 show that etching of the tungsten is retarded, or prevented, during the cleaning process if the deionized water content of the cleaning solution (formed of fluoric acid, nitric acid and water) for cleaning the silicon surface is 80 wt % or less. As such, the etch selectivity of the polysilicon layer with respect to the thermal oxide layer may be reduced. Removal or etching of the silicon oxide layer and the tungsten gate electrode may be reduced and the silicon surface may be selectively etched despite exposing the silicon surface, the silicon oxide layer and the tungsten gate electrode during the cleaning process.

Figure 10:
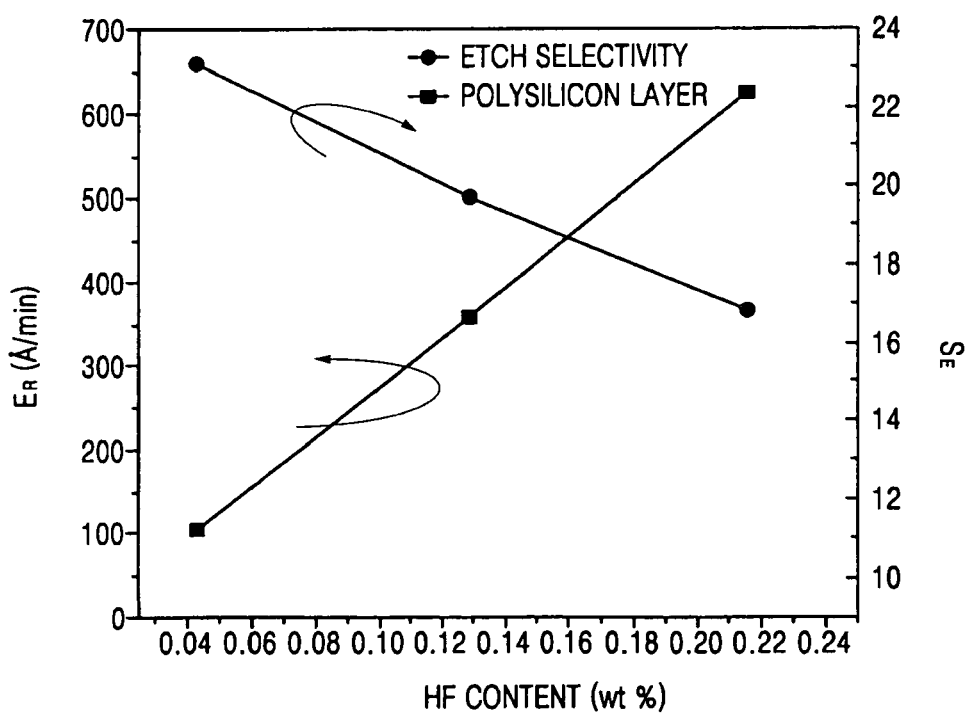

FIG. 10 is a graph illustrating the relationship between etch characteristics of a polysilicon layer and a thermal oxide layer in relation to a fluoric acid content of a cleaning solution according to example embodiments of the present invention. The cleaning solution is formed of fluoric acid, nitric acid and water.

The results of FIG. 10 were obtained by forming a polysilicon layer and a thermal oxide layer on a silicon substrate. The polysilicon layer and the thermal oxide layer were etched at a room temperature while increasing the fluoric acid content of a cleaning solution formed of fluoric acid, nitric acid and water. In the same manner as described above with reference to FIG. 9, the cleaning solution is prepared by mixing 0.043 wt % of fluoric acid, 33 wt % of nitric acid and 66.957 wt % of deionized water. In FIG. 10, data indicated by a symbol '-■-' represents an etch rate ($E_R$) of the polysilicon layer and data indicated by a symbol '-●-' represents an etch selectivity ($S_E$) of the polysilicon layer with respect to the thermal oxide layer.

As shown in FIG. 10, as the fluoric acid content of the cleaning solution increases, the etch selectivity of the polysilicon layer decreases with respect to the etch selectivity of the thermal oxide layer and an etch rate of the polysilicon layer increases. As such, the etch rate of tungsten may be reduced by adjusting or maintaining the water content to less than 80 wt %, and the etch rate of silicon may be controlled by adjusting the fluoric acid content. When the fluoric acid content is higher, the cleaning process may be difficult to control. As such, the content of fluoric acid may vary in a range of 0.01% to 1 wt %.

Figure 11:
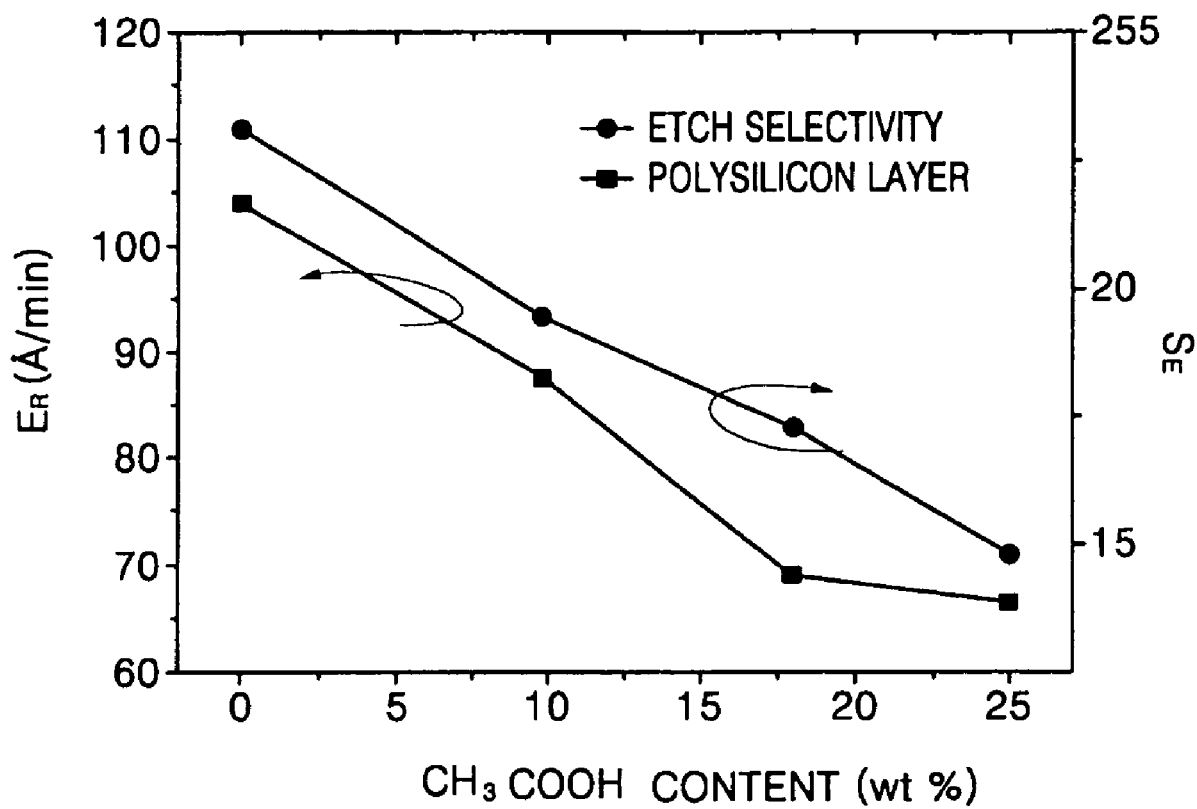

FIG. 11 is a graph illustrating the relationship between etch characteristics of a polysilicon layer and a thermal oxide layer and an acetic acid content added to a cleaning solution according to example embodiment of the present invention. The cleaning solution is formed of fluoric acid, nitric acid and water.

The results of FIG. 11 were obtained by forming a polysilicon layer and a thermal oxide layer on a silicon substrate. The polysilicon layer and the thermal oxide layer formed on the silicon substrates were etched at a room temperature while increasing the acetic acid content added to the cleaning solution formed of fluoric acid, nitric acid and water. In the same manner as described above with reference to FIG. 9, the cleaning solution is prepared by mixing 0.043 wt % of fluoric acid, 33 wt % of nitric acid and 66.957 wt % of deionized water. In FIG. 11, data indicated by a symbol '-■-' represents an etch rate ($E_R$) of the polysilicon layer and data indicated by a symbol '-●-' represents an etch selectivity ($S_E$) of the polysilicon layer with respect to the thermal oxide layer.

As shown in FIG. 11, the etch rate of the polysilicon layer and an etch selectivity of the polysilicon layer with respect to the thermal oxide layer decrease as the acetic acid (added as a diluent) content increases. The acetic acid is added with a content of 20 wt % or less in order to maintain the desired parameter values or higher. As shown in FIG. 11, when the acetic acid content is 20 wt %, an etch rate of the polysilicon layer may be maintained at 50 Å/min or higher and an etch selectivity of the polysilicon layer with respect to the thermal oxide layer may be maintained at 15 or higher.

As described above, according to the example embodiments of the present invention, by optimizing or improving the composition of a cleaning solution used to selectively clean an exposed silicon surface during the fabrication processes of a semiconductor device, etching damage and/or corrosion of a metal gate electrode (e.g., tungsten) may be reduced and the exposed silicon surface may be etched.

The foregoing is illustrative of the example embodiments of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of fabricating a semiconductor device comprising:

preparing a substrate having an exposed silicon surface; and cleaning the exposed silicon surface, using a cleaning solution including 0.01 to 1 wt % of fluoric acid, 20 to 50 wt % of oxidizer and 50 to 80 wt % of water.

2. The method according to claim 1, wherein the cleaning solution further comprises 1 to 20 wt % of acetic acid.

3. The method according to claim 1, wherein the oxidizer is nitric acid or phosphoric acid.

4. The method according to claim 1, wherein cleaning the exposed silicon surface is performed at a temperature of about 20 to 50° C.

5. The method according to claim 1, wherein the exposed silicon surface is a single crystal silicon surface or a polysilicon surface.

6. The method according to claim 1, further comprising forming a metal silicide layer or an epitaxial layer on the exposed silicon surface after cleaning the exposed silicon surface.

7. The method according to claim 1, wherein preparing the substrate includes forming a gate pattern, selectively exposing the exposed silicon surface.

8. The method according to claim 7, wherein the gate pattern is formed from a polysilicon layer pattern.

9. The method according to claim 7, wherein the gate pattern is formed from a plurality of stacked layers including a sequentially stacked polysilicon layer pattern and tungsten layer pattern.

10. The method according to claim 7, wherein the gate pattern is formed from a plurality of stacked layers including a sequentially stacked polysilicon layer pattern, tungsten nitride layer pattern, tungsten layer pattern and capping layer pattern.

11. The method according to claim 1, wherein preparing the substrate includes forming an insulating layer on the substrate; and forming an opening in the insulating layer.

12. The method according to claim 11, wherein the cleaning solution further comprises 1 to 20 wt % of acetic acid.

13. The method according to claim 11, wherein the oxidizer is nitric acid or phosphoric acid.

14. The method according to claim 11, wherein cleaning the exposed silicon surface is performed at a temperature of 20 to 50° C.

15. The method according to claim 11, wherein the insulating layer is formed from a silicon oxide layer.

16. The method according to claim 11, further comprising forming a gate pattern on the substrate before forming the insulating layer, wherein a portion of the substrate adjacent to the gate pattern includes the exposed silicon surface.

17. The method according to claim 1, wherein the cleaning solution consists essentially of 0.01 to 1 wt % of fluoric acid, 20 to 50 wt % of phosphoric acid, 50 to 80 wt % of water and 1 to 20 wt % of acetic acid.

* * * * *